United States Patent
Suzuki et al.

(10) Patent No.: US 6,835,595 B1
(45) Date of Patent: Dec. 28, 2004

(54) SEMICONDUCTOR PACKAGE, SEMICONDUCTOR DEVICE, ELECTRONIC DEVICE, AND METHOD OF MANUFACTURING SEMICONDUCTOR PACKAGE

(75) Inventors: Takanao Suzuki, Tokyo (JP); Masatoshi Inaba, Tokyo (JP); Tadanori Ominato, Tokyo (JP); Masahiro Kaizu, Tokyo (JP); Akihito Kurosaka, Tokyo (JP); Masatoshi Inaba, Tokyo (JP); Nobuyuki Sadakata, Tokyo (JP); Mutsumi Masumoto, Hiji-machi (JP); Kenji Masumoto, Hiji-machi (JP)

(73) Assignees: Fujikura Ltd., Tokyo (JP); Texas Instruments Japan Limited, Tokyo (JP)

( * ) Notice: Subject to any disclaimer, the term of this patent is extended or adjusted under 35 U.S.C. 154(b) by 330 days.

(21) Appl. No.: 09/744,976

(22) PCT Filed: Jun. 13, 2000

(86) PCT No.: PCT/JP00/03836

§ 371 (c)(1),
(2), (4) Date: Jun. 4, 2001

(87) PCT Pub. No.: WO00/77844

PCT Pub. Date: Dec. 21, 2000

(30) Foreign Application Priority Data

Jun. 15, 1999 (JP) .......................................... 11-169008

(51) Int. Cl.⁷ ........................ H01L 21/44; H01L 21/48; H01L 21/50; H01L 21/4763; H01L 23/12; H01L 23/053; H01L 23/14

(52) U.S. Cl. ..................... 438/107; 438/618; 257/701; 257/702

(58) Field of Search ................................ 438/107, 618; 257/701, 702

(56) References Cited

U.S. PATENT DOCUMENTS

| 5,844,782 A | 12/1998 | Fukasawa |
| 5,874,782 A | 2/1999 | Palagonia |
| 5,925,931 A | * 7/1999 | Yamamoto .................. 257/737 |
| 6,211,572 B1 | 4/2001 | Fjelstad et al. |
| 6,284,563 B1 | 9/2001 | Fjelstad |

FOREIGN PATENT DOCUMENTS

| JP | 1-209746 | 8/1989 |
| JP | 11-8250 | 1/1999 |
| JP | 11-54896 | 2/1999 |
| JP | 11-204678 | 7/1999 |
| JP | 11-307694 | 11/1999 |
| JP | 2000-58695 | 2/2000 |
| JP | 2000-150716 | 5/2000 |
| JP | 2000-174078 | 6/2000 |

OTHER PUBLICATIONS

U.S. patent application Ser. No. 09/762,681, filed Feb. 12, 2001, pending.
U.S. patent application Ser. No. 09/744;976, filed Feb. 15, 2001, pending.

\* cited by examiner

*Primary Examiner*—Carl Whitehead, Jr.
*Assistant Examiner*—Nema Berezny
(74) *Attorney, Agent, or Firm*—Oblon, Spivak, McClelland, Maier & Neustadt, P.C.

(57) ABSTRACT

An insulating layer (3) having an opening portion (3a) at a position conformable to an electrode pad (2) is formed. Next, a resin projection portion (4) is formed on the insulating layer (3). Thereafter, a resist film is formed which has opening portions made in regions conformable to the opening portion (3a), the resin projection portion (4) and the region sandwiched therebetween. A Cu plating layer (6) is formed by electrolytic copper plating, using the resist film as a mask.

8 Claims, 8 Drawing Sheets

(a)

(b)

(c)

(a)

(b)

(c)

(a)

(b)

(a)

(b)

(c)

(d)

(e)

SEMICONDUCTOR PACKAGE, SEMICONDUCTOR DEVICE, ELECTRONIC DEVICE, AND METHOD OF MANUFACTURING SEMICONDUCTOR PACKAGE

TECHNICAL FIELD

The present invention relates to a semiconductor package, such as a wafer level CSP (Chip Size/Scale Package), using no wiring board (interposer), a semiconductor device, an electronic device, and a method for producing the semiconductor package; and particularly to a semiconductor package, a semiconductor device and an electronic device which can be produced with ease, and a method for producing the semiconductor package.

BACKGROUND ART

In recent years, a development of small-sized semiconductor devices has been promoted. With this development, attention is paid to the miniaturization of the packages of these semiconductor devices. For instance, a variety of semiconductor packages have been proposed in the August issue (1998) and February issue (1999) of Nikkei Microdevice. Among these packages, especially a wafer level CSP using a semiconductor package called CSP has a high effect on the miniaturization of a package and a reduction in costs. This CSP is a package resin-sealed together with a wafer. FIG. 9 is a sectional view showing the structure of a conventional CSP. Incidentally, FIG. 9 shows the condition that the above CSP will be mounted on a printed circuit board and the vertically positional relation between the parts explained hereinafter is reversed with respect to those of FIG. 9.

In the conventional CSP, plural Al pads 52 are formed on a wafer 51. Also a SiN layer 53 and a polyimide layer 54 which cover the Al pads 52 are formed on the entire surface of the wafer 51. In the SiN layer 53 and the polyimide layer 54, a via hole which reaches the Al pad 52 from the surface of the polyimide layer 54 is formed and a conductive layer 55 is embedded in the via hole. On the polyimide layer 54, a rerouting layer 56 connected to the conductive layer 55 is formed. The rerouting layer 56 is formed of, for example, Cu. A sealing resin layer 57 coating the rerouting layer 56 is formed on the entire surface of the polyimide layer 54. Inside the sealing resin layer 57, a Cu post 58 which reaches the rerouting layer 56 from the surface of the sealing resin layer 57 is formed as a metal post. A barrier metal layer 59 is formed on the Cu post 58 and a solder ball 60 such as a solder is formed on the barrier metal layer 59.

Next, a method for producing the conventional CSP as mentioned above will be explained. FIGS. 10 (a) to (e) are sectional views showing the method for producing the conventional CSP in step order. Incidentally, the rerouting layer, the polyimide layer and the like are omitted in FIGS. 10 (a) to (e).

Firstly, as shown in FIG. 10 (a), a wafer 61 with a flat surface is prepared. As shown in FIG. 10 (b), plural Cu posts 62 are formed on the wafer 61 by plating. Next, as shown in FIG. 10 (c), all Cu posts 62 are resin-sealed such that they are encased to form a sealing resin layer 63. Then, as shown in FIG. 10 (d), the surface of the sealing resin layer 63 is polished to expose each Cu post 62. Thereafter, as shown FIG. 10 (e), a solder ball 64 such as a solder is mounted on each Cu post 62.

The CSP as described above is thus formed. This CSP is made into a given size by dicing afterwards.

Since a semiconductor package is in general different from a printed circuit board or the like in thermal expansion coefficient, a stress based on the difference in thermal expansion coefficient focuses on a terminal of the semiconductor package. However, in the above-mentioned CSP, the stress is easily dispersed by making the cylindrical Cu post 62 have a large height.

However, in order to disperse the stress based on the difference in thermal expansion coefficient, it is necessary for a metal post, such as a Cu post, to have a height as large as about 100 μm from the rerouting layer. However, if a metal post having such a height is formed by plating, there is a problem that a remarkable long period of time is required. This further gives rise to the problems of increased production cost and a difficulty in control of the height of the metal post.

In light of such problems, the present invention has been made. It is an object of the present invention to provide a semiconductor package, a semiconductor device and an electronic device which make it possible to disperse a stress produced when the package is mounted on a printed circuit board or the like and which can be produced for a short time, and a method for producing the semiconductor package.

DISCLOSURE OF THE INVENTION

A semiconductor package according to the present invention comprises: an insulating layer formed on a wafer that is provided with an electrode; an opening portion made in a region conformable to the electrode in the insulating layer; a rerouting layer connected to the electrode through the opening portion; a sealing resin layer which seals the wafer, the insulating layer, and the rerouting layer; and a post penetrating through the sealing resin layer, a solder bump being formed on an upper surface of the post, wherein the post comprises: a resin projection portion formed on the insulating layer; and a conductive layer that coat at least an upper surface of the resin projection portion and are connected to the rerouting layer and the solder bump.

In the present invention, the post is provided with the resin projection portion wherein at least the upper surface thereof is coated with the conductive layer. Therefore, in the case that stress is generated in this post, the stress is dispersed mainly by the resin projection portion. For this reason, no thick plating layer is necessary for the post, so that the production process is shortened. Since the height of the post can be controlled by the height of the resin projection portion, the adjustment thereof is easy.

By making an area of the opening portion made in the sealing resin layer through which the post penetrates larger than that of the upper surface of the post, the contact area between the solder bump and the conductive layer can be made large. Therefore, the reliability of ensuring electric conduction and adhesive strength is improved. In this case, a boundary between the post and the sealing resin layer may be present outside the upper surface of the post as is viewed in plan.

In the case that the inner surface of the opening portion made in the sealing resin layer is inclined inwards to form a groove surrounding a periphery of the upper surface of the post and the boundary is divided by the groove, the flexibility of the deformation of the resin projection portion becomes large on the basis of resin-removal. Thus, the stress is still more easily dispersed.

In the case that at least one part of a periphery of the post is coated with the sealing resin layer and the sealing resin layer is formed to have such a thickness that its upper surface apart from the post is lower than the upper surface of the post, the flexibility of the deformation of the resin projection portion becomes large in the same way. Thus, the stress is still more easily dispersed.

Another semiconductor package according to the present invention comprises: a wafer that is provided with an electrode; a resin projection portion formed on the wafer; a conductive layer formed on the resin projection portion and connected to the electrode; a solder bump formed on the conductive layer above the resin projection portion; and a sealing resin layer which seals the wafer with the solder bump being exposed.

In this case, the stress acting from the solder bump to the resin projection portion can be still more uniformly dispersed if a position of the center of the solder bump is consistent with a position of the center of the resin projection portion as are viewed in plan.

A shape of the resin projection portion may be truncated cone.

The semiconductor device provided with any one of the above-mentioned semiconductor packages according to the present invention comprises an integrated circuit formed in the wafer.

The electronic device provided with this semiconductor device according to the present invention comprises a circuit board connected to the solder bump.

A method for producing a semiconductor package according to the present invention comprises the steps of: forming, on a wafer that is provided with an electrode, an insulating layer provided with an opening portion in a region conformable to the electrode; forming a resin projection portion on the insulating layer; forming a rerouting layer connected to the electrode through the opening portion; forming a conductive layer connected to the rerouting layer and coating the resin projection portion; forming a sealing resin layer which seals the wafer, the insulating layer and the rerouting layer and has an opening portion above the conductive layer; and forming a solder bump on the conductive layer in the opening portion of the sealing resin layer.

The step of forming the sealing resin layer may comprise the steps of: forming a photosensitive resin layer on the entire surface; and forming an opening portion in the photosensitive resin layer, the opening portion exposing the conductive layer on the resin projection portion by photolithography.

An area of a topmost portion of the opening portion in the sealing resin layer may be larger than that of an upper surface of the conductive layer on the resin projection portion.

BEST MODE FOR CARRYING OUT THE INVENTION

Figure 1:
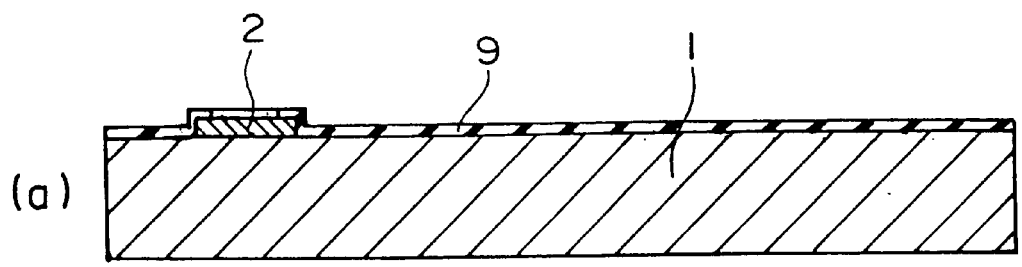
FIGS. 1 (a) to (c) are sectional views showing a method for producing a semiconductor package according to a first embodiment of the present invention in step order.
Figure 1:
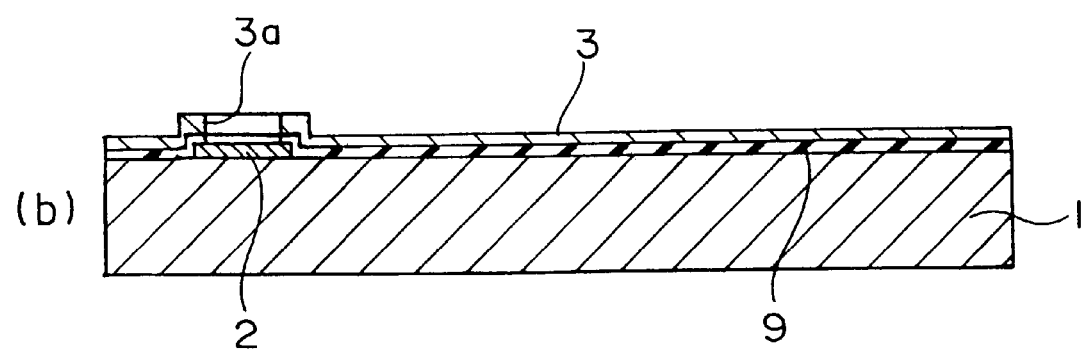
Figure 1:
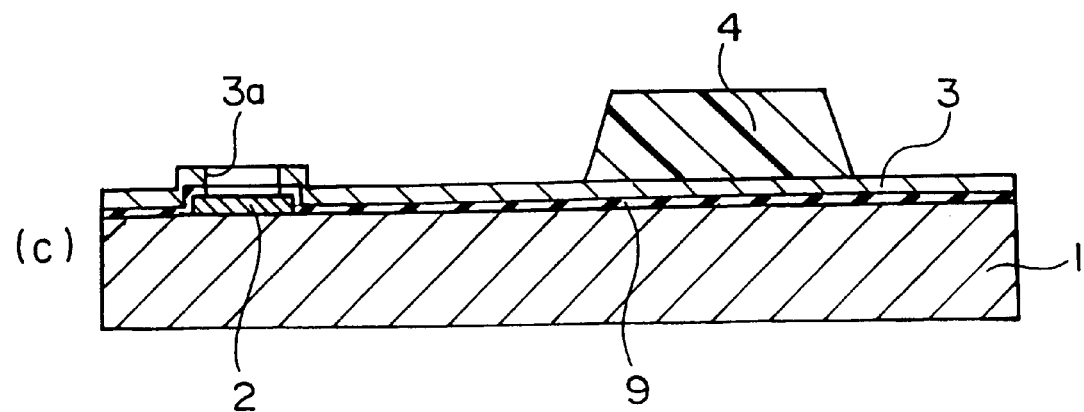

A method for producing a semiconductor package according to embodiments of the present invention will be hereinafter explained in detail with reference to the appended drawings. FIGS. 1 (a) to (c), FIGS. 2 (a) to (c), and FIGS. 3 (a) and (b) are sectional views showing a method for producing a semiconductor package according to a first embodiment of the present invention in step order.

In the present embodiment, as shown in FIG. 1 (a), there is first prepared a product wherein a passivation film 9, made of SiN or the like, is directly formed on the entire surface of a Si wafer 1 in which an integrated circuit (not shown) and electrodes thereof, for example, an Al pad 2, are disposed. An opening portion is made at the position conformable to the Al pad 2 in the passivation film 9, so that the Al pad 2 is exposed.

Thereafter, as shown in FIG. 1 (b), an insulating layer 3 made of a resin and having an opening portion 3a at the position conformable to the Al pad 2 is formed. The insulating layer 3 is made of, for example, a polyimide, epoxy or silicone resin. The thickness thereof is, for example, from 5 to 50 μm. The insulating layer 3 can be made by, for example, spin coating method, printing method, laminating method or the like. The opening portion 3a can be made, for example, by depositing a film that is made of polyimide or the like and constitutes the resin layer 3 on the entire surface and subsequently patterning the film by photolithography.

Next, as shown in FIG. 1 (c), a projection portion 4 that is made of a resin and has a truncated cone shape (trapezoidal section; a resin projection portion having a shape obtained by removing, from a cone, its upper side) is formed at a position which is apart from the electrode above the wafer, and on the insulating layer 3. The trapezoidal projection portion 4 is made of, for example, a polyimide, epoxy or silicone resin. The thickness thereof is, for example, from 25 to 100 μm. The projection portion 4 can be formed, from polyimide or the like, by printing method, laminating method, spin coating method or the like.

Figure 2:
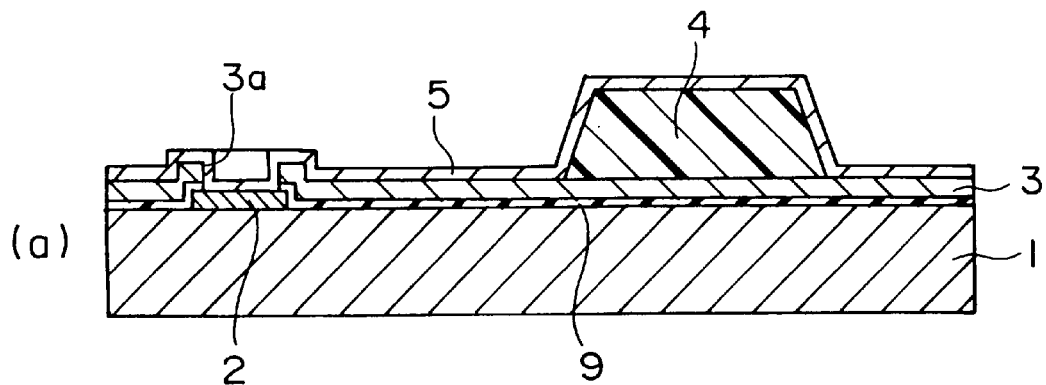
FIGS. 2 (a) to (c) are also views showing the method for producing the semiconductor package according to the first embodiment of the present invention, the views being sectional views showing steps subsequent to the steps shown in FIG. 1.
Figure 2:
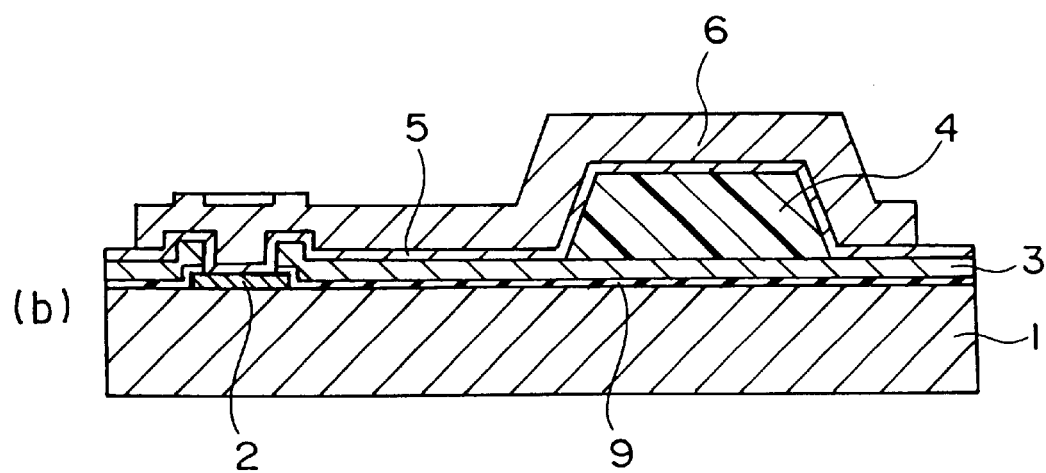
Figure 2:
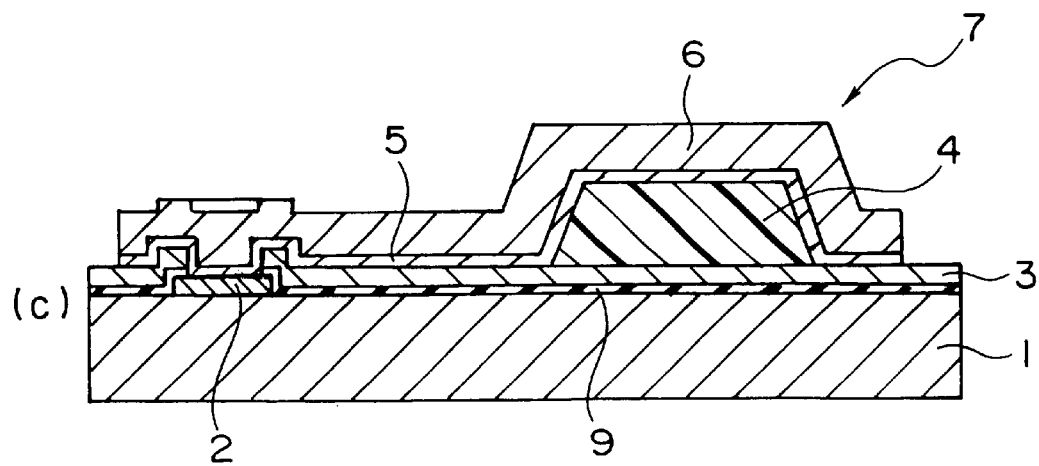

Subsequently, as shown in FIG. 2 (a), a thin seed layer 5 for electrolytic plating is formed on the entire surface or regions requiring it. The seed layer 5 is, for example, a laminate formed by a sputtering method and either consisting of a Cu layer and a Cr layer or consisting of a Cu layer and a Ti layer. The seed layer 5 may be either an electroless Cu plating layer or a metallic thin film layer formed by vapor deposition method, application method or chemical vapor deposition (CVD) method or the like; or a combination of these layers.

Next, a resist film (not shown) for electrolytic plating is formed on the seed layer 5. This resist film is provided with the opening portion 3a, the projection portion 4, and an opening portion formed in a region conformable to the region sandwiched between these portions. The resist film may be formed, for example, using a method of laminating a film resist or a method of spin-coating a liquid resist. Thereafter, as shown in FIG. 2 (b), a Cu plating layer 6, which is a conductive layer, is formed on the exposed seed layer 5 by electrolytic copper plating, using the resist film as a mask. By the above-mentioned steps, a wiring path (a circuit pattern), made of the Cu plating layer 6, is formed on the Si wafer 1. The thickness of the Cu plating layer 6 is, for example, 5 to 50 $\mu$m. Thereafter, for example, a Ni plating layer and a Au plating layer (not shown) may be formed on the Cu plating layer 6 to improve wettability of a solder bump that will be formed later.

Figure 4:
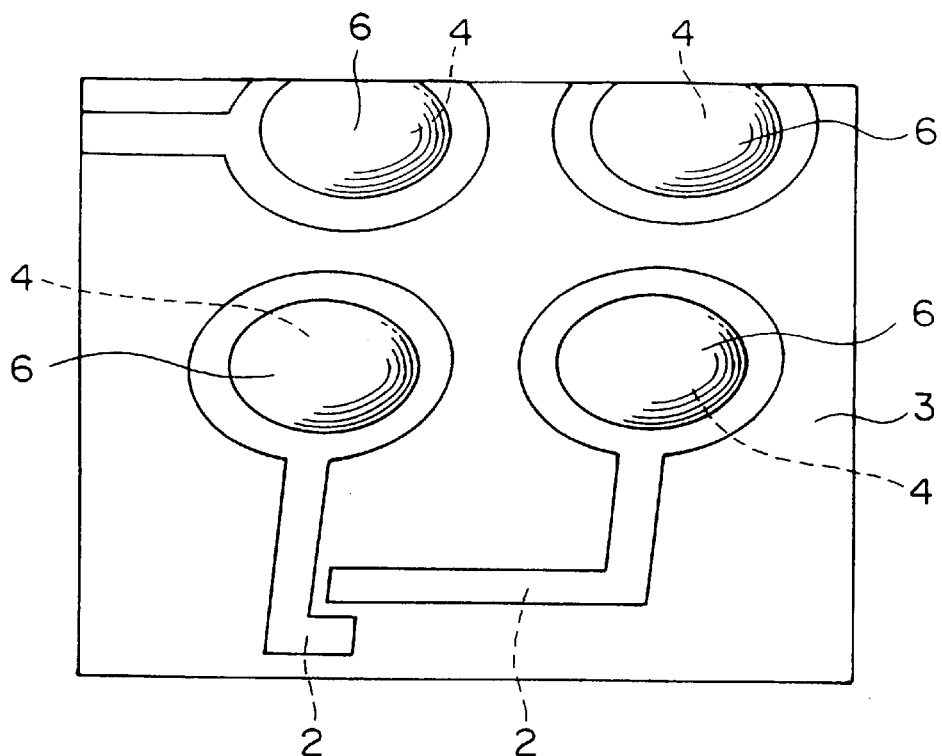
FIG. 4 is a view obtained by tracing a photograph showing a state after a seed layer 5 is removed in the first embodiment.

Subsequently, as shown in FIG. 2 (c), the resist film is exfoliated and the unnecessary seed layer 5 which is bare on the surface of the wafer is removed by etching so that the insulating layer 3 is made bare in a region except the conductive layer 6. In this manner, a post 7 coated with the conductive layer is formed on the Si wafer 1. FIG. 4 is a view obtained by tracing a photograph showing the surface state of the Si wafer 1 after the seed layer 5 is removed in the first embodiment, in which the wafer is diagonally viewed from the side thereof. In FIG. 4, the trapezoidal projection portions 4, the electrodes 2 and the conductive layer 6 for connecting them to each other are shown on the wafer. The conductive layer 6 between the electrode 2 and the projection portion 4 makes the wiring path on the Si wafer 1. As shown in FIG. 4, some wiring paths do not make the shortest straight path between the electrode 2 and the resin projection portion 4, and may be bent.

Figure 3:
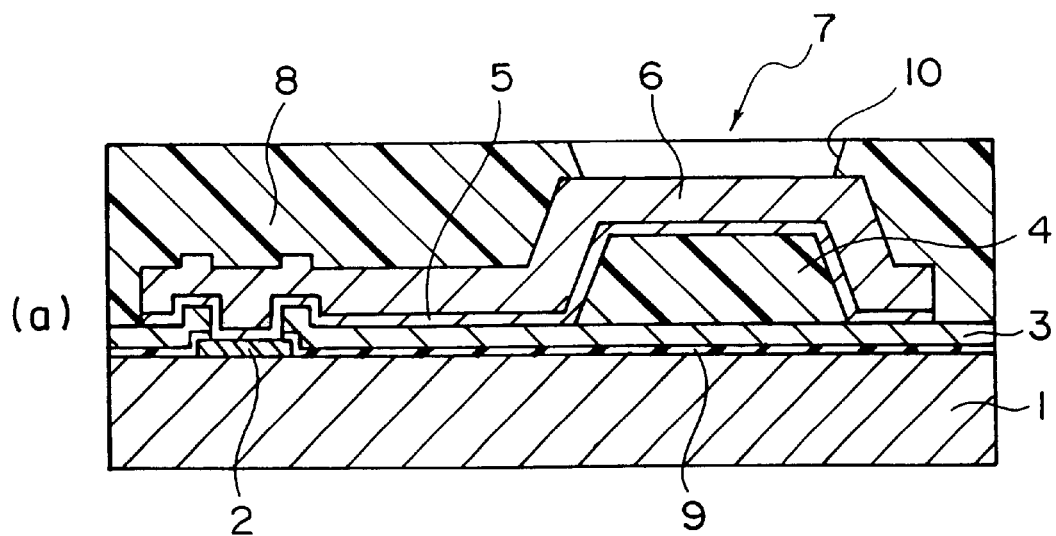
FIGS. 3 (a) and (b) are also views showing the method for producing the semiconductor package according to the first embodiment of the present invention, the views being sectional views showing steps subsequent to the steps shown in FIG. 2.
Figure 3:
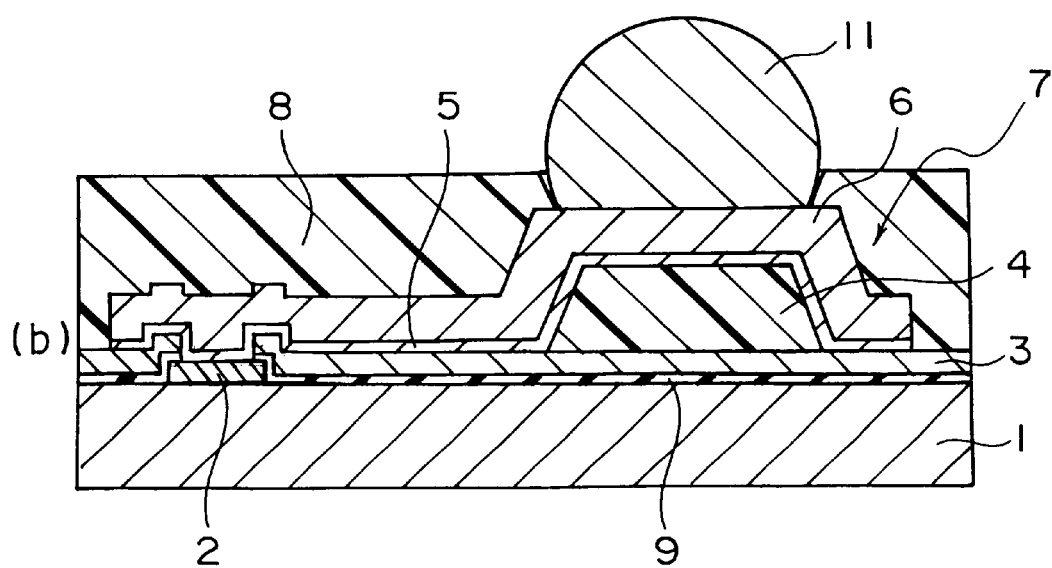
Figure 5:
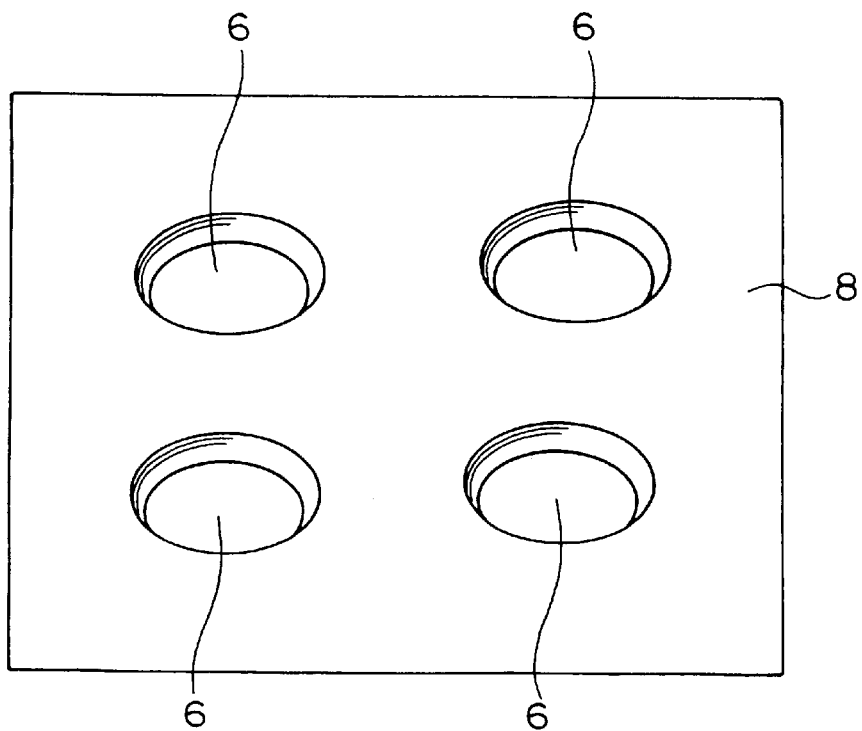
FIG. 5 is a view obtained by tracing a photograph showing a state after a sealing resin layer 8 is formed in the first embodiment.

Subsequently, as shown in FIG. 3 (a), the entire surface is coated with a sealing resin layer 8 for surface-protection, which has a thickness of about 10 to 150 $\mu$m, in the manner that the sealing resin layer 8 swells around the periphery of the surface of the post 7 and only the center thereof is exposed. In other words, the area of an opening portion 10 made in the sealing resin layer 8 is made smaller than that of the upper surface of the post 7. As this sealing resin layer, a polyimide resin, an epoxy resin or a silicone resin can be preferably used. FIG. 5 shows, after the sealing resin layer 8 is formed, the surface state in the first embodiment, and is a view obtained by tracing a photograph wherein the wafer is diagonally viewed from the side direction thereof. The step of forming the sealing resin layer 8 can be carried out, for example, by making the sealing resin layer 8 of a photosensitive resin, such as a photosensitive polyimide resin, and then patterning this layer by photolithography. However, this method is not restrictive.

Next, for example, a solder bump 11 is formed on the surface of the post 7. Examples of the method for forming the solder bump 11 include plating, printing and metal jetting methods, and a method of putting a solder ball on the surface. It is important for uniform dispersion of stress that the center of the solder bump 11 and that of the resin projection portion 4 are consistent with each other, as are viewed in plan (from the upper of the wafer). In other words, it is important that the center position of the solder bump 11, which is round as is viewed in plan, and the center position of the round resin projection portion 4 are consistent with each other.

The post 7 of the semiconductor package produced in this manner has a shape as shown in FIG. 2 (c) and FIG. 4. That is the seed layer 5 and the 20-$\mu$m Cu plating layer 6 are formed on the upper surface and the side surface of the resin projection portion 4, which has a trapezoidal section and whose height is, for example, 30 $\mu$m, so as to cover the projection portion 4. The post having a height of 50 $\mu$m as a whole is formed. Therefore, in the case that the wafer is mounted on a printed circuit board and stress is generated, the stress is uniformly dispersed by the flexible resin projection portion 4 so that strain given to the wafer is relieved. The seed layer 5 and the Cu plating layer 6 also function as a rerouting layer between the solder bump and the Al pad 2. This rerouting layer corresponds to the above-mentioned rerouting path.

As described above, according to the present embodiment, it is possible to keep electric conductivity and disperse the stress uniformly even if there is no plating layer having a thickness as large as 100 $\mu$m. Accordingly, the package can be produced for a short time by the simplification of the plating step, and costs for producing it can be reduced. Since the height of the post 7 can be controlled by the height of the projection portion 4, the adjustment thereof can be attained by only the adjustment of a resin-swelling amount. This is easy.

Figure 6:
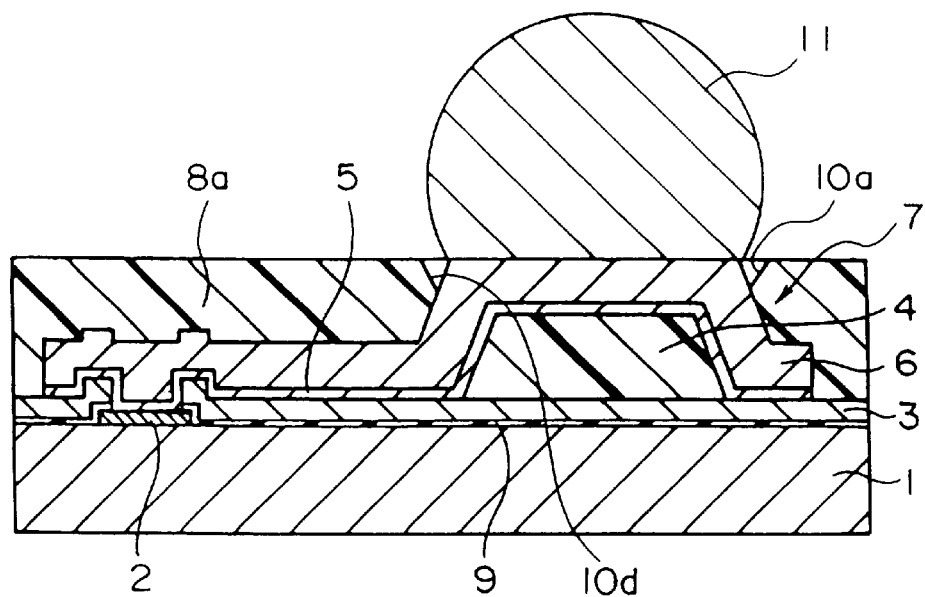
FIG. 6 is a sectional view showing a semiconductor package produced according to a second embodiment of the present invention.

The following will describe a second embodiment. FIG. 6 is a sectional view showing a semiconductor package produced according to the second embodiment of the present invention. In the second embodiment shown in FIG. 6, to the same constituents as in the first embodiment shown in FIG. 3 (b) are attached the same reference numbers and detailed description thereof is omitted. The second embodiment is different from the first embodiment in that none of the upper surface of a post is coated with a sealing resin layer.

Figure 7:
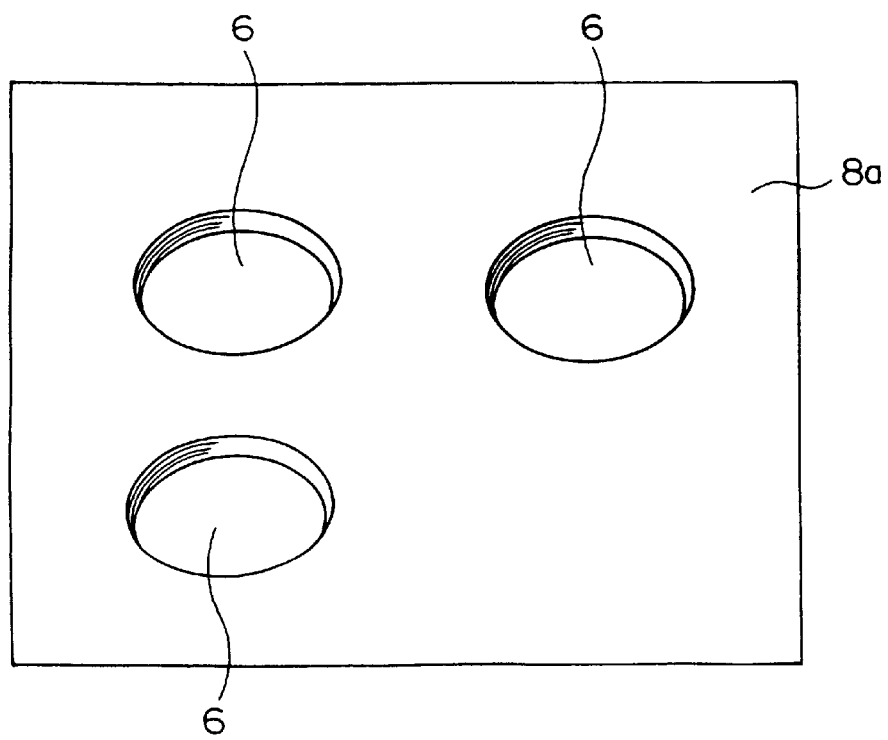
FIG. 7 is a view obtained by tracing a photograph showing a state after a sealing resin layer 8a is formed in the second embodiment.

In the second embodiment, the Cu plating layer 6 is formed and the unnecessary seed layer 5 is removed in the same steps as in the first embodiment. Thereafter, as shown in FIG. 6, a sealing resin layer 8a for surface-protection is formed on the entire surface in the manner that the surface of the post 7 is exposed and a groove is made between the sealing resin layer 8a and the post 7. In other words, the area of the round opening portion 10a in the sealing resin layer 8a is made larger than that of the round upper surface of the post 7. In the opening portion in the sealing resin layer 8a, its inside surface 10d is inclined inwards, that is, toward the side of the wafer. In short, the inside surface 10d falls in. A round groove that surrounds the post 7 is made around the post 7. This groove divides the post 7 from the sealing resin layer 8a. FIG. 7 is a view obtained by tracing a photograph showing a state after the sealing resin layer 8a is formed in the second embodiment. It will be understood that the ring-like groove is made to surround the conductive layer 6 that is bare on the post 7. Thereafter, the solder bump 11 is formed on the surface of the post 7 in the same way as in the first embodiment. Examples of the depth of the groove vary. As shown, there are various modified examples, for example, a groove which is cut off to the upper portion of the post 7 and has a shallow depth, and a groove which is cut off to the lower portion thereof.

In the case that the semiconductor package produced according to the second embodiment as described above is mounted on a printed circuit board and stress is generated, the stress is dispersed by the projection portion 4 in the post 7. Particularly in the second embodiment, since the side of the post 7 is not completely covered with the sealing resin layer 8a and no sealing resin layer 8a is present above the post 7, no circumference of the post 7 is fixed by the sealing resin layer 8a. Thus, in the second embodiment the post 7 deforms more easily than in the first embodiment. Namely, the resin projection portion constituting the post 7 deforms easily. For this reason, the effect of the stress-dispersion is still higher. The seed layer 5 and the Cu plating layer 6 also function as a rerouting layer between the solder bump and the Al pad 2.

The step of forming the sealing resin layer 8a may be a step of forming a resin layer for covering the Cu plating layer 6 and then subjecting the resin layer to surface-polishing until the Cu plating layer 6 is exposed.

Figure 8:
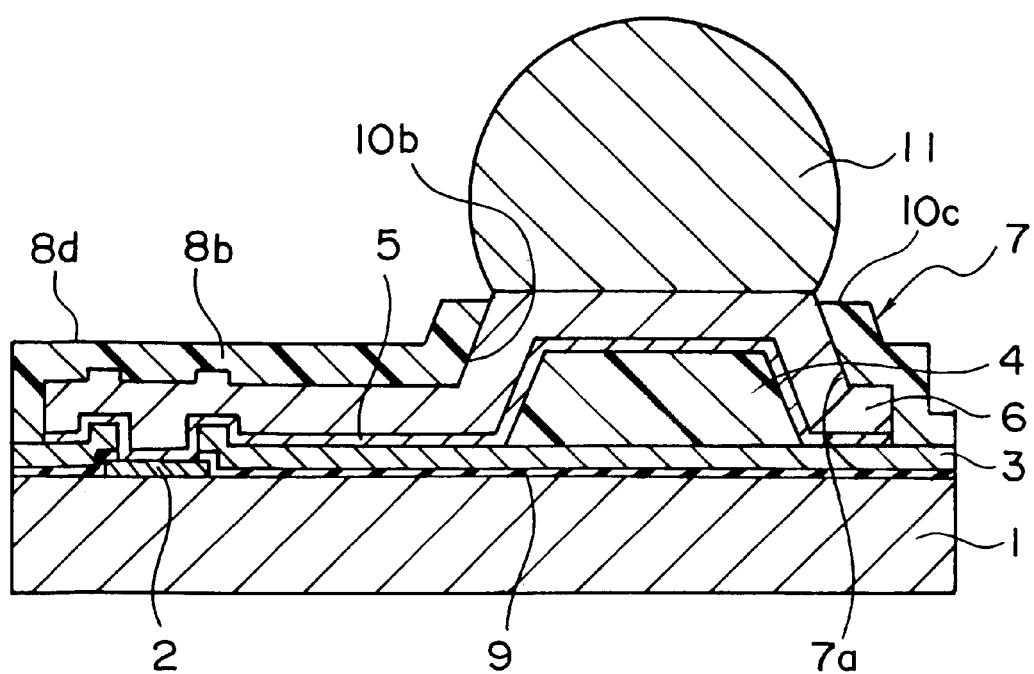
FIG. 8 is a sectional view showing a semiconductor package produced according to a third embodiment of the present invention.
Figure 9:
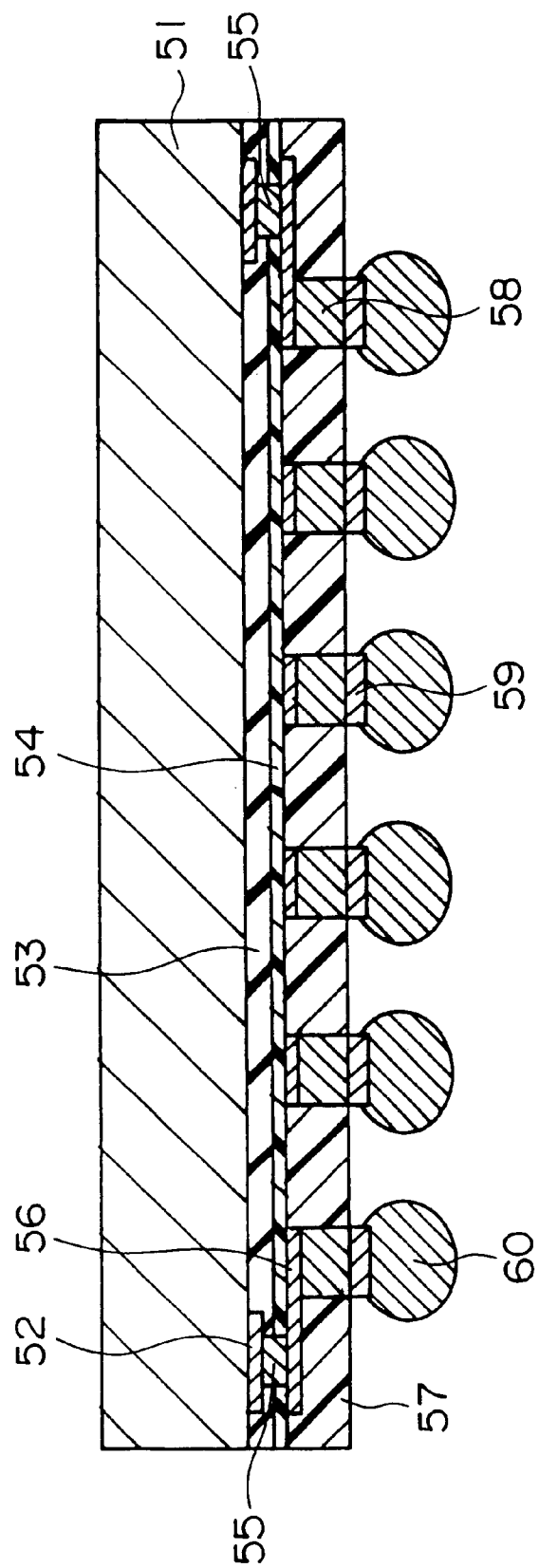
FIG. 9 is a sectional view showing the structure of a conventional CSP.
Figure 10:
FIGS. 10 (a) to (e) are sectional views showing a method for producing the conventional CSP in step order.
Figure 10:
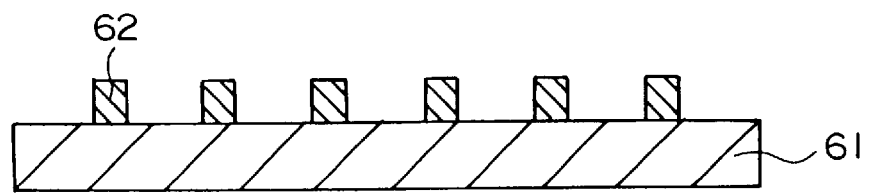
Figure 10:
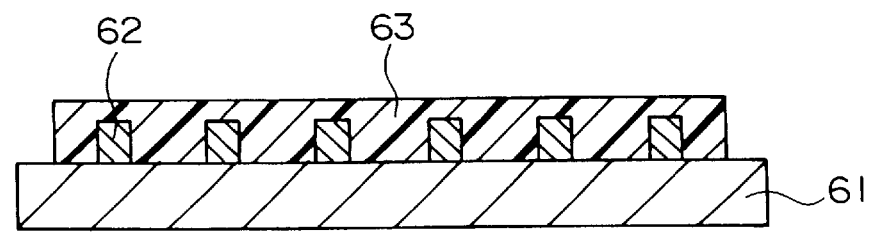
Figure 10:
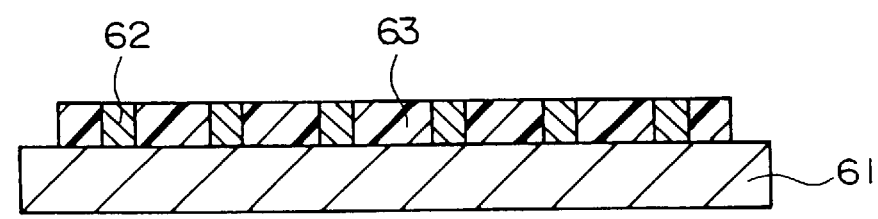
Figure 10:
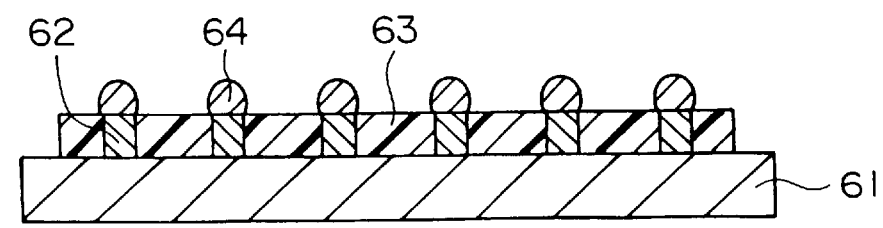

The following will describe a third embodiment. FIG. 8 is a sectional view showing a semiconductor package produced according to the third embodiment of the present invention. In the third embodiment shown in FIG. 8, to the same constituents as in the first embodiment shown in FIG. 3 (b) are attached the same reference numbers and detailed description thereof is omitted.

In the third embodiment, the Cu plating layer 6 is formed the unnecessary seed layer 5 is removed in the same step as in the first embodiment. Thereafter, as shown in FIG. 8, a sealing resin layer 8b for surface-protection is formed in regions except the upper surface of the post 7 and the upper part of the side surface of the post 7. In this case, therefore, an opening portion 10b in the sealing resin layer 8b has a larger area than the area of the upper surface of the post 7. Subsequently, the solder bump 11 is formed on the surface of the post 7 in the same way as in the first embodiment. The upper surface 8d of the sealing resin layer 8b at the position apart from the post 7 is lower than the upper surface of the post 7. An inner edge 7a of the opening portion 10b in the sealing resin layer 8b surrounds the periphery of the post 7. The inner edge 7a crawls up the side surface of the post 7 to make a thin layer around the post.

A tip 10c of this inner edge 7a is slightly lower than the upper surface of the post 7. Namely, the periphery of the post 7 or a part thereof is coated with the sealing resin layer 8b. The sealing resin layer 8b is formed to have such a thickness that the surface 8d apart from the post 7 is lower than the upper surface of the post 7. The tip 10c of the inner edge 7a may be consistent with the upper surface of the post 7.

In the post 7 of the semiconductor package produced according to the third embodiment as described above, the side surface of the post 7 is not completely covered with the sealing resin layer 8b. Since the sealing resin layer 8b is not present particularly in the circumference of the upper part of the post 7, the post 7 deforms easily in the same way as in the second embodiment. Therefore, the effect of stress-dispersion becomes still stronger, as is compared with the first embodiment. The thickness of the sealing resin layer 8b (that is, the inner edge 7a of the opening portion 10b) around the post 7 may be gradually thinner toward the upper side, which is not particularly shown. Since the upper surface of the Cu plating layer 6 is completely bare from the sealing resin layer 8b, the reliability of both ensuring electric conduction and mechanical connection is still higher.

The raw material of the resin projection portion made inside the post is not limited to a polyimide, epoxy, silicone resin or the like. If a material makes it possible to disperse the stress, the material can be used. The conductive layer in the post 7 does not necessarily coat the whole of the inside resin projection portion. It is sufficient that the conductive layer coats the resin projection portion at least above the region where the solder bump is formed. In the above-mentioned embodiments, the post 7 and the electrode 2 are connected to each other through the conductive layer 6. However, in order to uniformalize the stress distribution of the whole of the wafer, which is to be connected to a circuit board, on the surface thereof, the posts 7 that are not connected to the electrode 2 may be dispersed and arranged on the wafer 7.

The semiconductor package produced in these embodiments is afterward integrated into, for example, an electronic device by connecting the solder bump to a circuit board.

The electronic device is an apparatus obtained by combining this circuit board with a peripheral device or the like, and is, for example, a mobile phone or a personal computer.

As the insulating layer 3, there can be used a resin other than resins in the respective embodiments, or an insulating material other than resins.

The positional relationship between the electrode and the resin projection portion is not limited to that in these embodiments.

As the wafer, there can be used, for example, a compound semiconductor wafer made of GaAs, GaP, or the like, besides a Si wafer.

Industrial Applicability

As described in detail, according to the present invention, since the post is provided with the resin projection portion coated with the conductive layer, the stress generated in the post can be dispersed mainly by the resin projection portion. Therefore, it is possible to make unnecessary a thick plating layer which has been hitherto required for the post and to shorten the production process. Moreover, the height of the post can be controlled by the height of the resin projection portion. Thus, the control thereof is easy.

What is claimed is:

1. A semiconductor package, comprising:
   an insulating layer formed on a wafer that is provided with an electrode;
   an opening portion made in a region conformable to said electrode in said insulating layer;
   a rerouting layer connected to said electrode through said opening portion;
   a sealing resin layer which seals said wafer, said insulating layer, and said rerouting layer; and
   a post penetrating through said sealing resin layer, a solder bump being formed on an upper surface of said post;
   wherein said post comprises:
     a resin projection portion formed on said insulating layer; and
     a conductive layer that coats at least an upper surface of said resin projection portion and is connected to said rerouting layer and said solder bump;
   wherein a boundary between said post and said sealing resin layer is present outside said upper surface of said post as is viewed in plan; and
   wherein an inner surface of said opening portion made in said sealing resin layer is inclined inwards to form a groove surrounding a periphery of said upper surface of said post, and said boundary is divided by said groove.

2. A semiconductor package according to claim 1, wherein a surface area of the upper surface of said resin projection is no larger than an outer surface area of all of the solder bump formed on the upper surface of said post.

3. A semiconductor package, comprising:
   a wafer that is provided with an electrode;
   a resin projection portion formed on said wafer;
   a conductive layer formed on said resin projection portion and connected to said electrode;
   a solder bump formed on said conductive layer above said resin projection portion; and a sealing resin layer which seals said wafer with said solder bump being exposed wherein a position of the center of said solder bump is consistent with a position of said center of said resin projection portion as are viewed in plan.

4. The semiconductor package according to claim 3, wherein a surface area of an upper surface of said resin projection is no larger than an outer surface area of all of the solder bump formed on said conductive layer.

5. A semiconductor package, comprising:

an insulating layer formed on a wafer that is provided with an electrode;

an opening portion made in a region conformable to said electrode in said insulating layer;

a rerouting layer connected to said electrode through said opening portion;

a sealing resin layer which seals said wafer, said insulating layer, and said rerouting layer; and a post penetrating through said sealing resin layer, a solder bump being formed on an upper surface of said post;

wherein said post comprises:

a resin projection portion formed on said insulating layer; and a conductive layer that coats at least an upper surface of said resin projection portion and is connected to said rerouting layer and said solder bump;

wherein a shape of said resin projection portion is a truncated cone.

6. A method for producing a semiconductor package comprising the steps of:

forming, on a wafer that is provided with an electrode, an insulating layer provided with an opening portion in a region conformable to said electrode;

forming a resin projection portion on said insulating layer;

forming a rerouting layer connected to said electrode through said opening portion;

forming a conductive layer connected to said rerouting layer and coating said resin projection portion;

forming a sealing resin layer which seals said wafer, said insulating layer and said rerouting layer and has an opening portion above said conductive layer; and forming a solder bump on said conductive layer in said opening portion of said sealing resin layer;

wherein the step of forming said sealing resin comprises the steps of:

forming a photosensitive resin layer an entire surface; and forming an opening portion in said photosensitive resin layer, said opening portion exposing said conductive layer on said resin projection portion by photolithography, wherein an area of a topmost portion of said opening portion in said sealing resin layer is larger than that of an upper surface of said conductive layer on said resin projection portion.

7. The method for producing a semiconductor package according to claim 6, wherein a surface area of an upper surface of said resin projection is no larger than an outer surface area of all of the solder bump formed on said conductive layer.

8. A semiconductor package, comprising:

a wafer that is provided with an electrode;

a resin projection portion formed on said wafer;

a conductive layer formed on said resin projection portion and connected to said electrode;

a solder bump formed on said conductive layer above said resin projection portion; and a sealing resin layer which seals said wafer with said solder bump being exposed;

wherein a shape of said resin projection portion is a truncated cone.

* * * * *